(12) United States Patent
Sousa et al.

(10) Patent No.: US 7,626,221 B2
(45) Date of Patent: Dec. 1, 2009

(54) MAGNETORESISTIVE RANDOM ACCESS MEMORY WITH HIGH CURRENT DENSITY

(75) Inventors: Ricardo Sousa, Grenoble (FR); Bernard Dieny, Lans en Vercors (FR); Olivier Redon, Seyssinet Pariset (FR)

(73) Assignees: Commissariat a l'Energie Atomique, Paris (FR); Centre National de la Recherche, Paris (FR)

( * ) Notice: Subject to any disclaimer, the term of this patent is extended or adjusted under 35 U.S.C. 154(b) by 0 days.

(21) Appl. No.: 11/062,926

(22) Filed: Feb. 23, 2005

(65) Prior Publication Data

US 2005/0195658 A1 Sep. 8, 2005

(30) Foreign Application Priority Data

Mar. 5, 2004 (FR) .................................. 04 02354

(51) Int. Cl.
 *H01L 21/00* (2006.01)
(52) U.S. Cl. .................................................... 257/295
(58) Field of Classification Search ................. 257/295, 257/421, 422, E43.001–E43.007, E27.005–E27.006, 257/E27.008, E29.164, E29.167, E29.272, 257/E29.323, E21.436, E21.663–E21.665; 438/3, 785, E21.208; 365/171, 158
See application file for complete search history.

(56) References Cited

U.S. PATENT DOCUMENTS

| 6,272,041 B1 * | 8/2001 | Naji ............................ 365/171 |
| 6,621,730 B1 * | 9/2003 | Lage ........................... 365/158 |
| 6,781,873 B2 * | 8/2004 | Ishikawa et al. ............. 365/158 |
| 6,944,049 B2 * | 9/2005 | Hoenigschmid et al. ..... 365/158 |
| 6,950,335 B2 | 9/2005 | Dieny et al. |
| 6,980,466 B2 * | 12/2005 | Perner et al. ................. 365/158 |
| 2003/0031045 A1 | 2/2003 | Hosotani |
| 2003/0086313 A1 | 5/2003 | Asao |
| 2003/0189853 A1 | 10/2003 | Tanizaki et al. |

FOREIGN PATENT DOCUMENTS

| FR | 2832542 | 5/2003 |
| JP | A 2003-298025 | 10/2003 |
| WO | WO 2004/057619 A1 | 7/2004 |

* cited by examiner

*Primary Examiner*—Dao H Nguyen
*Assistant Examiner*—Tram H Nguyen
(74) *Attorney, Agent, or Firm*—Oliff & Berridge, PLC

(57) ABSTRACT

The memory comprises, on a semi-conducting substrate, a matrix of cells arranged in lines and columns and each designed to store an information bit. Each cell of a column comprises a magnetic tunnel junction having a line terminal and a column terminal respectively connected to a line conductor and, by means of a transistor, to a first column conductor associated to said column and to a first adjacent column. A gate of the transistor is connected to a gate conductor. The column terminal of each tunnel junction of said column is connected, by means of an additional transistor, to a second column conductor associated to said column and to a second adjacent column. A gate of the additional transistor is connected to an additional gate conductor. The two transistors associated to a cell can have a common electrode.

16 Claims, 3 Drawing Sheets

US 7,626,221 B2

MAGNETORESISTIVE RANDOM ACCESS MEMORY WITH HIGH CURRENT DENSITY

BACKGROUND OF THE INVENTION

The invention relates to a magnetoresistive random access memory comprising, on a semi-conducting substrate, a matrix of cells arranged in lines and columns and each designed to store an information bit, each cell of a column comprising a magnetic tunnel junction having a line terminal and a column terminal respectively connected to a line conductor and, by means of a transistor equipped with a gate and with first and second electrodes, to a first column conductor, associated to said column and to a first adjacent column, the gate of the transistor being connected to a gate conductor.

STATE OF THE ART

In FIGS. 1 and 2, a magnetoresistive random access memory comprises a matrix of cells 2, arranged on a semi-conducting substrate 1, arranged in lines 3 and columns 4a to 4d and each designed to store an information bit. Each cell of a magnetoresistive random access memory comprises a magnetic tunnel junction whose electrical resistance is representative of the information to be stored.

Each magnetic tunnel junction has a line terminal and a column terminal, i.e. the ends of the junction, respectively connected to a corresponding line conductor 5 and, typically by means of a transistor, to a corresponding first column conductor (6ab, 6cd). In FIG. 1, a column conductor 6ab is associated to the adjacent columns 4a and 4b. Likewise, the column conductor 6cd is associated to the columns 4c and 4d. Thus, each pair of adjacent columns is associated to a common column conductor (6ab, 6cd), whereas each line is associated to a corresponding line conductor 5.

Each transistor is provided in conventional manner with a first and second electrode, respectively connected to the column terminal of the corresponding tunnel junction and to the corresponding column conductor 6, and with a gate constituting a control electrode. The gates of the transistors of a column (4a, 4b, 4c or 4d) of cells 2 are connected to a gate conductor (7a, 7b, 7c or 7d) associated to the column (4a, 4b, 4c or 4d). Thus, by applying suitable electric voltages to the column conductors 6, to the line conductors 5 and to the gate conductors 7, a junction can be selected and its resistance can be determined according to the voltages applied and to the current flowing in the junction.

For certain magnetic tunnel junctions, the electric current density flowing in the junction can reach a value of about $10^7$ A/cm$^2$, in particular in the case of information write methods based on thermal effects and/or spin injection effects. The current density depends on the materials and thicknesses of the electrodes of a junction. High current densities give rise to absolute current values that are also high. The transistors have to be designed to be able to withstand such currents and thus limit miniaturization of the memory, for a given current.

OBJECT OF THE INVENTION

The object of the invention is to remedy these shortcomings and, in particular, to provide a magnetoresistive random access memory of reduced size.

According to the invention, this object is achieved by the accompanying claims and, more particularly, by the fact that the column terminal of each tunnel junction of a column is connected, by means of an additional transistor equipped with a gate and with first and second electrodes, to a second column conductor, the gate of the additional transistor being connected to an additional gate conductor.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
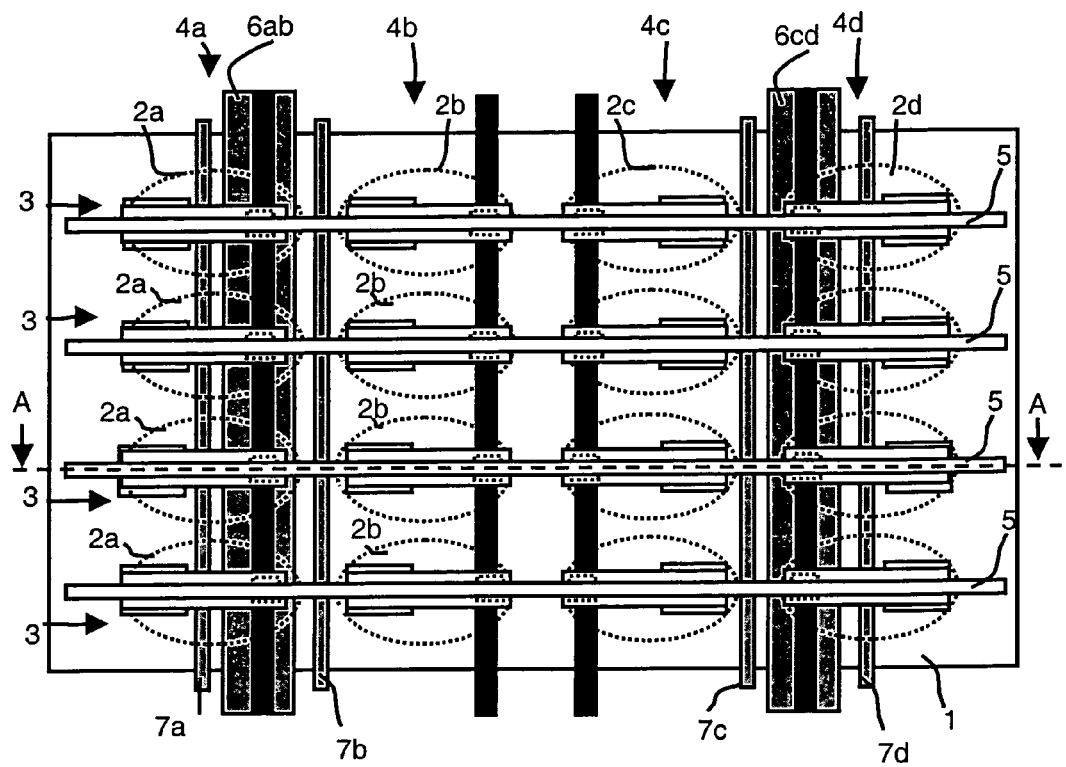
FIG. 1 schematically illustrates a magnetoresistive random access memory according to the prior art.
Figure 2:
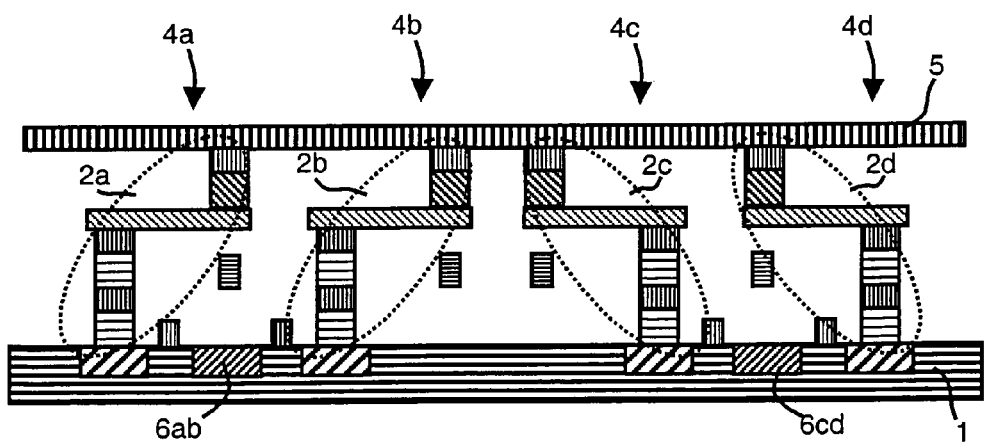
FIG. 2 represents the memory according to FIG. 1, in cross-section along the axis A-A.
Figure 3:
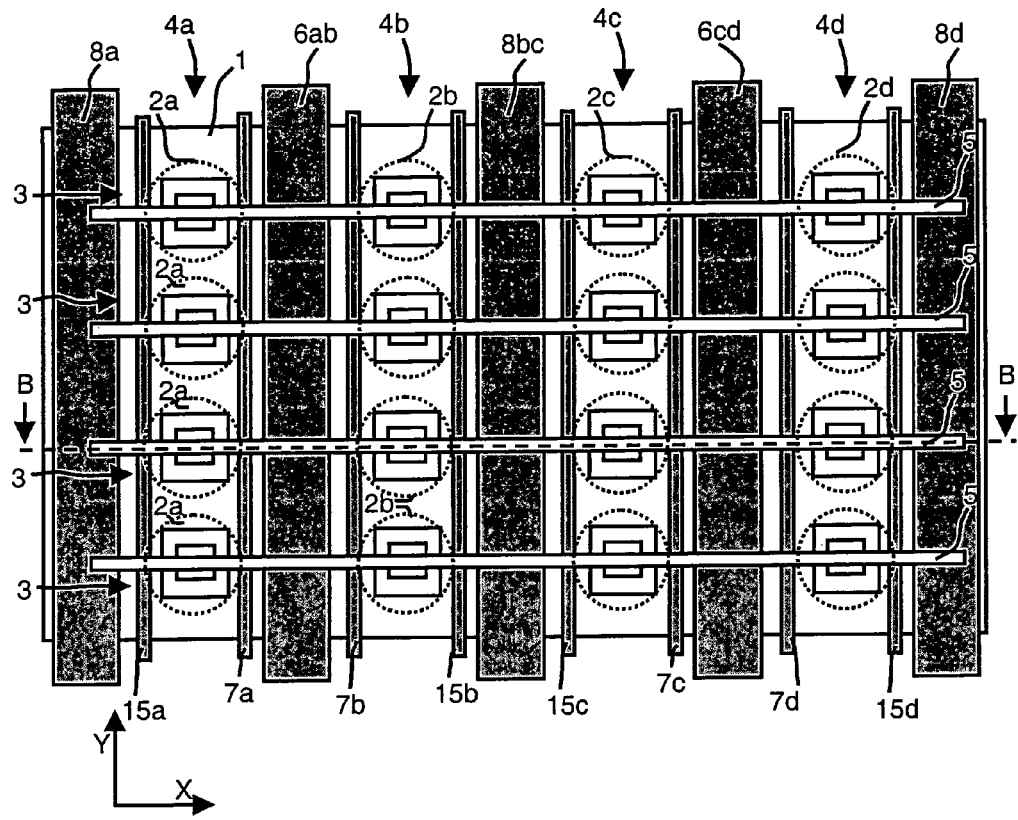
FIG. 3 illustrates, in top view, a particular embodiment of a magnetoresistive random access memory according to the invention.
Figure 4:
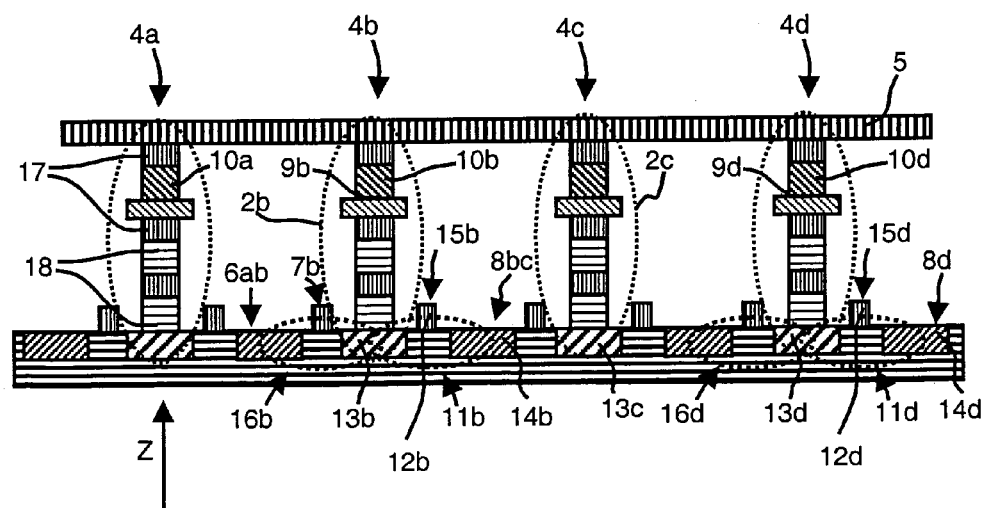
FIG. 4 represents the memory according to FIG. 3, in cross-section along the axis B-B.

The magnetoresistive random access memory represented in FIGS. 3 and 4 comprises not only first column conductors 6ab and 6cd, but also second column conductors 8a, 8bc and 8d. The column terminal 9b of each tunnel junction 10b of the column 4b is then connected, by means of a transistor 16b, to the first column conductor 6ab and, by means of an additional transistor 11b, to the second column conductor 8bc. The second column conductor 8bc is associated both to the column 4b and to a second adjacent column, notably column 4c. The additional transistor 11b is equipped with a gate 12b and with first 13b and second 14b electrodes. The gate 12b of the additional transistor 11b is connected to an additional gate conductor 15b. Thus, each cell 2 is connected, by means of two transistors 11 and 16, to a first column conductor 6 and a second column conductor 8. The gate conductors 7 and 15 are preferably parallel to the column conductors 6 and 8. Each second column conductor 8bc associated to a central column 4b, i.e. not situated at the ends, is associated to another adjacent column 4c.

Thus, an electric current flowing through the tunnel junction 10b is divided into two fractions, flowing respectively through the additional transistor 11b and the transistor 16b. As each fraction of current is substantially lower than the current flowing through the junction 10b, the transistors 11b and 16b can be of substantially smaller size than the transistors used in the memory according to the prior art. For example, the size of a transistor along an axis Y, parallel to the column conductors, can be reduced by substantially 50%, and the number of cells 2 can thus be substantially doubled per unit length of column along the axis Y. The additional transistors 11, the second column conductors 8 and the additional gate conductors 15 require an increase of about 20% of the size of the memory along an axis X, perpendicular to the axis Y in the plane of the substrate 1, applying current design rules of a CMOS-0.18 μm technology. Thus, the mean surface of a storage cell 2 can be reduced to 60% of the surface of a memory cell according to the prior art.

A control device, not shown, of conventional type, enables the two transistors 11b and 16b associated to a cell 2b to be activated independently. For example, when the current flowing through the junction 10b is lower than the saturation current of a transistor 11*b* or 16*b*, a single one of these transistors (11*b* or 16*b*) can be sufficient.

In FIGS. 3 and 4, the column terminal 9*d* of each tunnel junction 10*d* of the end column 4*d* is connected, by means of an additional transistor 11*d*, to the second column conductor 8*d* which is only associated to the column 4*d*. The gate 12*d* of the additional transistor 11*d* is connected to an additional gate conductor 15*d*. A similar configuration applies for the end column 4*a*, as represented in FIGS. 3 and 4.

The two transistors 11*b* and 16*b* associated to the same cell 2*b* preferably have a common first electrode 13*b*, as represented in FIG. 4.

In similar manner, the two adjacent transistors 11*b* and 16*c* respectively associated to two adjacent cells 2*b* and 2*c* of a line 3 of cells 2 preferably have a common second electrode 14*b*. As represented in FIGS. 3 and 4, the corresponding column conductor 8*bc* preferably integrates the column of common second electrodes 14*b*. The first 13 and second 14 electrodes can respectively be the drain and source of the transistors or vice-versa.

The magnetic tunnel junctions 10 are preferably connected to the corresponding line conductors 5 and to the associated transistors 11 and 16 by means of interconnections 17 and metal layers 18. To increase the temperature of the tunnel junction 10 in the case of a thermally assisted write step, the interconnections 17 can comprise one or more layers, arranged near the tunnel junction 10 and formed by a material having a low thermal conductivity, i.e. less than 5 W/mK, which enables the heat dissipated in the cell to be confined. The layer of material having a low thermal conductivity preferably has a low electrical resistivity, less than 100 μΩm, so that it represents a low resistance in series with the resistance of the tunnel junction 10.

Writing of information in the memory represented in FIGS. 3 and 4 can be performed by spin injection. Thus, writing is based on the direction of the electric current flowing through a cell during writing. This technique presents the advantage of not requiring bulky additional conductors. Thus, as represented in FIG. 4, the magnetic tunnel junction 10*b* of a cell 2*b*, the first electrode 13*b*, the interconnections 17 and the metal layers 18 associated to the cell 2*b* are preferably aligned along an axis Z perpendicular to the substrate 1.

Figure 5:
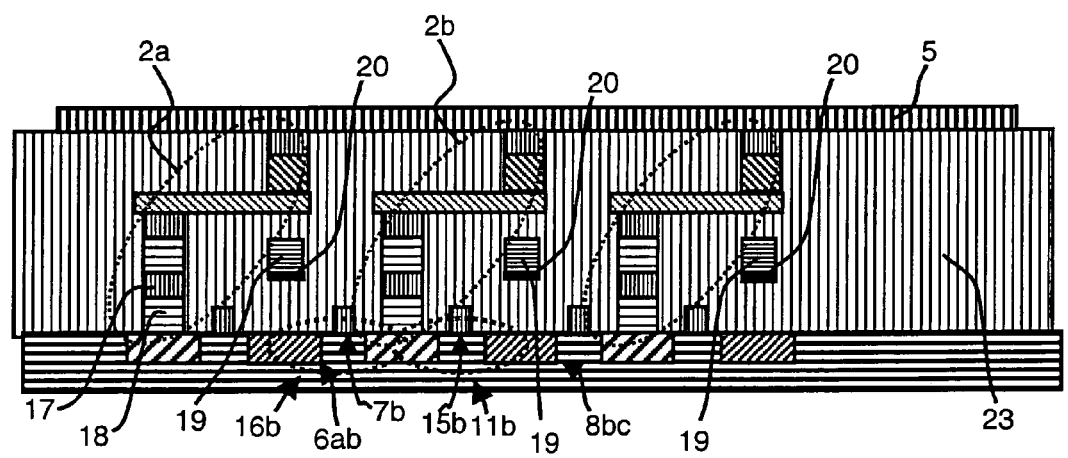
FIGS. 5 and 6 represent, in cross-section, two other particular embodiments of a magnetoresistive random access memory according to the invention.
Figure 6:
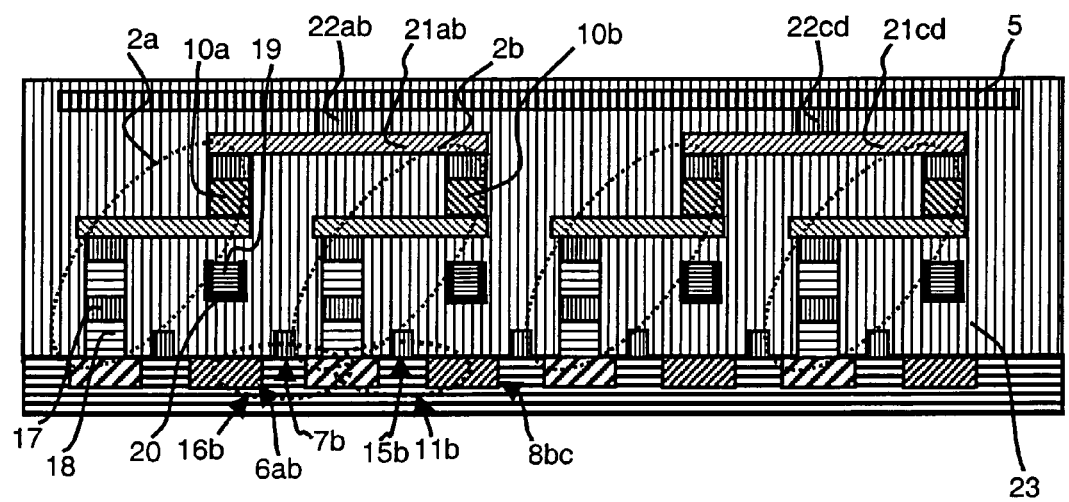

In FIGS. 5 and 6, the memory comprises a plurality of parallel current conductors 19 electrically insulated from the magnetic tunnel junctions 10, each associated to a column 4 of cells 2 and arranged so as to be able to create a magnetic field at the location of the magnetic tunnel junctions 10 of the cells 2 of the associated column 4. The current conductors 19 preferably comprise a ferromagnetic coating 20, for example a soft magnetic material such as a nickel and iron alloy comprising 80% nickel and 20% iron. This alloy has a high magnetic permeability and a low magnetic anisotropy, preferably aligned along the longitudinal axis of the current conductor 19. The ferromagnetic coating 20 covers at least one face of the current conductor 19 opposite the face facing the junction 10, as represented in FIG. 5. In FIG. 6, the coating also covers the side faces of the current conductor 19. The coating 20 enables the magnetic field lines to be focussed in the direction of the tunnel junction 10, thus creating the same field as for a non-coated conductor, but with a lower current.

When an information write is performed in the memories represented in FIGS. 5 and 6, a current flowing in a current conductor 19 creates a magnetic field making it possible to define a magnetization state of a tunnel junction 10 the temperature whereof is increased by Joule effect generated by a heating current flowing through the junction 10. The heating current is controlled by the voltages applied to the corresponding line conductor 5, to the gate conductors 6 and 8 and to the associated gate conductors 7 and 15. When the heating current is higher than the saturation current of a transistor 11 or 16, the two associated transistors 11 and 16 are used. The maximum value of the heating current necessary in the course of writing determines the size of the transistors 11 and 16 and therefore the number of cells 2 per unit length of column along the axis Y.

In FIGS. 5 and 6, a current conductor 19 is arranged between the magnetic tunnel junctions 10 of the associated column of cells 4 and the substrate 1. The interconnections 17 between the tunnel junction 10 and the transistors 11 and 16 are then laterally offset with respect to the tunnel junction 10 and to the corresponding current conductor 19, which are aligned along the axis Z. The current conductors 19 are preferably arranged very close to the tunnel junctions 10 so as to maximize the magnetic field acting on the junctions 10. Furthermore, the current flowing in a current conductor 19 generates heat by Joule effect in the current conductor 19, which enables the tunnel junction 10 to be heated more when writing is performed or at least enables the heat losses to be reduced. Thus, the resistivity of the material of the current conductors 19 is chosen so as to maximize the Joule effect without, however, exceeding a suitable maximum voltage.

In FIG. 6, two adjacent magnetic tunnel junctions 10*a* and 10*b* of a line of cells 3 are connected to the associated line conductor 5 by means of a common metal layer 21*ab* and by a common interconnection 22*ab*. The common metal layer 21 (21*ab*, 21*cd*) is preferably formed by a material having a high electrical conductivity, for example by copper or aluminium. Thus, when respective electric currents are simultaneously flowing through the two corresponding junctions 10*a* and 10*b*, the heat dissipated in the common interconnection 22*ab* is proportional to the square of the sum of the currents, which enables the tunnel junctions to be heated more during the write phases without increasing the heating current flowing in each tunnel junction 10. The number of adjacent magnetic tunnel junctions 10 grouped together by means of a common metal layer 21 and by a common interconnection 22 can be more than two and chosen, in combination with the resistance Rv of the common interconnection 22, so that the heat dissipated in the common interconnection 22 is comparable with the heat dissipated in the junction 10. It is possible to write in a cell or in several cells at the same time. The temperature increase of the junction 10, due to the heat dissipated in the common interconnection 22*ab*, when a write phase is performed, enables the heating current to be reduced, and therefore enables transistors of smaller size to be designed, which enables the number of cells 2 per unit length of column along the axis Y to be increased.

When a write phase is performed, it is possible to simultaneously activate the gate conductors 7 and/or 15 of several grouped cells or to activate only the gate conductors 7 and/or 15 of a single cell 2.

Whatever the embodiment, the memory preferably comprises, as represented for example purposes in FIG. 5, an insulating sealing material 23 covering at least the matrix of cells 2, the column conductors 6 and 8 and the current conductors 19, and even able to cover the line conductors 5 as illustrated in FIG. 6. The insulating sealing material 23 has a low thermal conductivity enabling the heat to be confined, when a thermally assisted write step is performed, and therefore enabling a given increased temperature to be obtained with a reduced heating current. The insulating material 23 is for example silica $SiO_2$ whose thermal conductivity is 1.4 W/mK.

The invention claimed is:

1. Magnetoresistive random access memory on a semiconducting substrate, comprising:
   a planar matrix of cells arranged in rows and columns, the rows and columns being substantially orthogonal to each other, each cell designed to store an information bit, each cell of a column comprising a magnetic tunnel junction, each magnetic tunnel junction comprising:
      a first terminal connected to a line conductor, the line conductor connecting a plurality of cells in a same row;
      a second terminal, the first and second terminals disposed on opposite sides of the magnetic tunnel junction, so that current flows through the magnetic tunnel junction to pass from the first terminal to the second terminal;
      a first and a second transistor each equipped with a gate, a first electrode and a second electrode; and
      the gate of the first transistor being connected to a first gate conductor and the gate of the second transistor being connected to a second gate conductor;
   wherein the first electrode of the first transistor and the first electrode of the second transistor are connected to the second terminal, and the second electrodes of the first and second transistor are connected to a first and a second adjacent column conductor, respectively, each adjacent column conductor extending to and connecting a plurality of cells in a same column,
   the first electrode of the first transistor and the first electrode of the second transistor are the same electrode.

2. Memory according to claim 1, wherein the matrix of cells comprises central columns and two end columns, and the second column conductor of each central column is associated to said column and to a second adjacent column.

3. Memory according to claim 1, wherein the gate conductors are parallel to the column conductor.

4. Memory according to claim 1, wherein two adjacent transistors respectively associated to two adjacent cells of a line of cells have a common second electrode.

5. Memory according to claim 4, wherein a column conductor integrates a column of common second electrodes.

6. Memory according to claim 1, wherein a magnetic tunnel junction is connected to the corresponding line conductor and to the associated transistors by means of interconnections and metal layers.

7. Memory according to claim 6, wherein the interconnections comprise a layer of material having a thermal conductivity smaller than 5 W/mK.

8. Memory according to claim 6, wherein the magnetic tunnel junction of a cell, a transistor electrode, the interconnections and the associated metal layers are aligned along an axis perpendicular to the substrate.

9. Memory according to claim 1, comprising a plurality of parallel current conductors electrically insulated from magnetic tunnel junctions, each parallel current conductor associated to a column of cells and arranged to create a magnetic field at a location of the magnetic tunnel junctions of the cells of the associated column.

10. Memory according to claim 9, wherein a current conductor comprises a ferromagnetic coating.

11. Memory according to claim 9, wherein a current conductor is arranged between the magnetic tunnel junctions of the associated column of cells and the substrate.

12. Magnetoresistive random access memory on a semiconducting substrate, comprising:
   a planar matrix of cells arranged in rows and columns, the rows and columns being substantially orthogonal to each other, each cell designed to store an information bit, each cell of a column comprising a magnetic tunnel junction, each magnetic tunnel junction comprising:
      a first terminal connected to a line conductor, the line conductor connecting a plurality of cells in a same row;
      a second terminal, the first and second terminals disposed on opposite sides of the magnetic tunnel junction, so that current flows through the magnetic tunnel junction to pass from the first terminal to the second terminal; and
      a first and a second transistor each equipped with a gate, a first electrode and a second electrode;
      the gate of the first transistor being connected to a first gate conductor and the gate of the second transistor being connected to a second gate conductor,
   wherein the first electrode of the first transistor and the first electrode of the second transistor are connected to the second terminal, and the second electrodes of the first and second transistor are connected to a first and a second adjacent column conductor, respectively, each adjacent column conductor connecting a plurality of cells in a same column, and
   at least two adjacent magnetic tunnel junctions of a line of cells are connected to the line conductor by means of a common metal layer and by a common interconnection.

13. Magnetoresistive random access memory on a semiconducting substrate, comprising:
   a planar matrix of cells arranged in rows and columns, the rows and columns being substantially orthogonal to each other, each cell designed to store an information bit, each cell of a column comprising a magnetic tunnel junction, each magnetic tunnel junction comprising:
      a first terminal connected to a line conductor, the line conductor connecting a plurality of cells in a same row;
      a second terminal, the first and second terminals disposed on opposite sides of the magnetic tunnel junction, so that current flows through the magnetic tunnel junction to pass from the first terminal to the second terminal; and
      a first and a second transistor each equipped with a gate, a first electrode and a second electrode;
      the gate of the first transistor being connected to a first gate conductor and the gate of the second transistor being connected to a second gate conductor;
   wherein the first electrode of the first transistor and the first electrode of the second transistor are connected to the second terminal, and the second electrodes of the first and second transistor are connected to a first and a second adjacent column conductor, respectively, each adjacent column conductor connecting a plurality of cells in a same column,
   at least two adjacent magnetic tunnel junctions of a line of cells are connected to the line conductor by means of a common metal layer and by a common interconnection; and
   the common metal layer is formed from a metal chosen from a group consisting of copper and aluminum.

14. Memory according to claim 1, comprising an insulating sealing material having a thermal conductivity of 1.4 W/mK and covering at least the matrix of cells and the column conductors.

15. Memory according to claim 14, wherein the insulating sealing material covers the line conductors.

16. Memory according to claim 1, wherein said second column conductor is arranged between said column and a second adjacent column.

* * * * *